United States Patent [19]
Buynoski

[11] Patent Number: 6,166,411
[45] Date of Patent: Dec. 26, 2000

[54] HEAT REMOVAL FROM SOI DEVICES BY USING METAL SUBSTRATES

[75] Inventor: Matthew Buynoski, Palo Alto, Calif.

[73] Assignee: Advanced Micro Devices, Inc., Sunnyvale, Calif.

[21] Appl. No.: 09/426,339

[22] Filed: Oct. 25, 1999

[51] Int. Cl.[7] .......................... H01L 27/01; H01L 29/00; H01L 23/495; H01L 21/30
[52] U.S. Cl. .......................... 257/347; 257/508; 257/677; 438/455; 438/459
[58] Field of Search .................. 257/347, 349, 257/352, 467, 469, 506, 508, 677, 753, 930; 438/455, 459, 479, 406, 759, 761, 763, 779

[56] References Cited

U.S. PATENT DOCUMENTS

| | | | |
|---|---|---|---|
| 5,126,820 | 6/1992 | Brown | 357/70 |
| 5,194,933 | 3/1993 | Miyagi | 257/753 |
| 5,234,535 | 8/1993 | Beyer et al. | 156/630 |
| 5,308,594 | 5/1994 | Chen | 117/222 |
| 5,446,959 | 9/1995 | Kim et al. | 29/827 |
| 5,463,241 | 10/1995 | Kubo | 257/376 |
| 5,488,004 | 1/1996 | Yang | 437/35 |
| 5,567,629 | 10/1996 | Kubo | 437/24 |
| 5,744,410 | 4/1998 | Komatsu et al. | 501/97.2 |
| 5,744,865 | 4/1998 | Jeng et al. | 257/750 |
| 5,770,881 | 6/1998 | Pelella et al. | 257/347 |
| 5,780,900 | 7/1998 | Suzuki et al. | 257/335 |
| 5,855,693 | 1/1999 | Murari et al. | 148/33.3 |
| 5,874,777 | 2/1999 | Ohmi et al. | 257/758 |
| 6,100,165 | 8/2000 | Sakaguchi et al. | 438/455 |

*Primary Examiner*—Matthew Smith
*Assistant Examiner*—Lex H. Malsawma
*Attorney, Agent, or Firm*—Amin, Eschweiler & Turocy, LLP

[57] ABSTRACT

In one embodiment, the present invention relates to a method of forming a silicon-on-insulator substrate involving providing a metal wafer; forming a low melting point oxide layer over the metal wafer; forming a first insulation layer over the low melting point oxide layer to provide a first structure; providing a second structure comprising a silicon layer and a second insulation layer; bonding the first structure and the second structure together so that the first insulation layer is adjacent the second insulation layer forming a buried insulation layer; and removing a portion of the silicon layer thereby providing the silicon-on-insulator substrate comprising a silicon device layer, the buried insulation layer, the low melting point oxide layer, and the metal wafer.

12 Claims, 2 Drawing Sheets

6,166,411

HEAT REMOVAL FROM SOI DEVICES BY USING METAL SUBSTRATES

TECHNICAL FIELD

The present invention generally relates to improved Silicon-on-Insulator devices. More particularly, the present invention relates to methods for removing heat from Siliconon-Insulator devices and devices having such characteristics.

BACKGROUND ART

Silicon-on-Insulator (SOI) technology is of growing importance in the field of integrated circuits. SOI technology involves forming transistors in a relatively thin layer of semiconductor material overlying a layer of insulating material. More particularly, SOI technology is characterized by the formation of a thin silicon layer (device region) for formation of the active devices over an insulating layer, such as an oxide, which is in turn formed over a substrate. Transistor sources and drains are formed, for example, by implantations into the silicon layer while transistor gates are formed by forming a patterned oxide and conductor layer structure.

Such structures provide a significant gain in performance by having lower parasitic capacitance (due to the insulator layer). Devices, such as metal oxide silicon field effect transistors (MOSFET), have a number of advantages when formed on SOI wafers versus bulk silicon MOS transistors. These advantages include: reduced source/drain capacitance and hence improved speed performance at higher-operating frequencies; reduced $N^+$ to $P^+$ spacing and hence higher packing density due to ease of isolation; absence of latch-up; lower voltage applications; and higher "soft error" upset immunity (i.e., the immunity to the effects of alpha particle strikes).

Although there are significant advantages associated with SOI technology, there are significant disadvantages as well. For example, poor heat removal from devices on an SOI substrate is a significant disadvantage. Electrical devices generate heat, and the inability to remove or dissipate the heat results in poor and/or inconsistent performance of the electrical devices, or even in some instances device and/or substrate degradation.

There is poor heat removal for devices on SOI substrates primarily because of the oxide insulation layer. More specifically, the oxide insulation layer has a markedly lower thermal conductivity than the thermal conductivity of conventional bulk silicon (typically used as semiconductor substrates), which typically surrounds semiconductor devices. For example, the thermal conductivity of silicon dioxide is about 1.4 W/m° C. while the thermal conductivity of conventional bulk silicon is about 150 W/m° C. As a result, the buried oxide layer undesirably insulates thermally the device region in SOI substrates.

In view of the aforementioned disadvantages, there is a need for SOI devices of improved quality, particularly SOI devices having improved heat removal characteristics, and more efficient methods of making such SOI devices.

SUMMARY OF THE INVENTION

As a result of the present invention, an SOI substrate having improved heat removal characteristics (from the device layer) is provided. By forming an SOI substrate according to the present invention, improved performance of devices subsequently formed on the SOI substrate is facilitated. Moreover, forming an SOI substrate in accordance with the present invention does not degrade or deleteriously effect the advantageous properties and characteristics commonly associated with SOI technology (improved speed performance at higher-operating frequencies, higher packing density, absence of latch-up, lower voltage applications, and higher "soft error" upset immunity).

In one embodiment, the present invention relates to a method of forming a silicon-on-insulator substrate involving providing a metal wafer; forming a low melting point oxide layer over the metal wafer; forming a first insulation layer over the low melting point oxide layer to provide a first structure; providing a second structure comprising a silicon layer and a second insulation layer; bonding the first structure and the second structure together so that the first insulation layer is adjacent the second insulation layer forming a buried insulation layer; and removing a portion of the silicon layer thereby providing the silicon-on-insulator substrate comprising a silicon device layer, the buried insulation layer, the low melting point oxide layer, and the metal wafer.

In another embodiment, the present invention relates to a method of facilitating heat removal from a device layer of a silicon-on-insulator substrate comprising a metal wafer, a low melting point oxide layer over the metal wafer, a buried insulation layer over the low melting point oxide layer, and a silicon device layer over the buried insulation layer, involving forming the low melting point oxide layer having a thickness from about 250 Å to about 1,000 Å between the metal wafer and the buried insulation layer, the metal wafer having a thermal coefficient of expansion from about $0.5 \times 10^{-6}$ cm/cm/° C. to about $10 \times 10^{-6}$ cm/cm/° C.

In yet another embodiment, the present invention relates to a silicon-on-insulator substrate, containing a metal wafer layer comprising at least one of Alloy 42, Alloy 46, Alloy 48, KOVAR®, and Invar 36; a low melting point oxide layer comprising at least one of tetraethylorthosilicate, borophosphotetraethylorthosilicate, phosphosilicate glass, and borophosphosilicate glass over the metal wafer layer; a buried insulation layer over the low melting point oxide layer; and a silicon device layer comprising silicon over the buried insulation layer.

DISCLOSURE OF INVENTION

Figure 1:
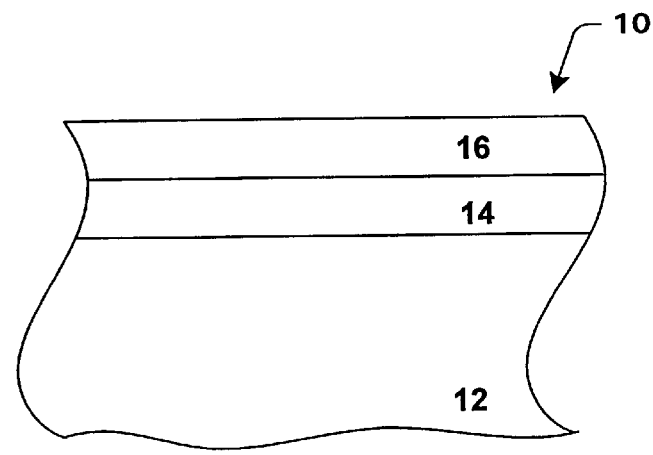
FIG. 1 is a cross-sectional view of a first structure used to make an SOI substrate according to one embodiment of the present invention.

By forming an SOI substrate having improved heat removal characteristics, the performance of devices subsequently formed on the SOI substrate can be substantially improved. While not wishing to be bound to any theory, it is believed that by forming a low melting point oxide layer under the buried insulation layer and replacing the bulk silicon substrate with a metal wafer according to the present invention, it is consequently possible to increase the amount of heat that may be removed (and/or increase the rate at which heat may be removed) from the device layer of the SOI substrate. Improving the removal of heat from the device layer consequently improves the performance and increases the life of devices, such as MOSFETs, formed on the device layer of the SOI substrate.

The present invention involves positioning a low melting point oxide layer adjacent and below the buried insulation layer of an SOI substrate, and using a metal wafer instead of bulk silicon to form the base of the SOI substrate. In the completed SOI substrate, the low melting point oxide layer and the metal wafer act as a heat spreader. The low melting point oxide layer and the base metal wafer have relatively high thermal conductivities (compared to silicon dioxide and bulk silicon, respectively) and thus facilitate the transfer of heat away from and/or evenly spread (preventing local build-up of) heat generated by active devices or other structures in the device layer of the SOI substrate.

The SOI substrate formed in accordance with the present invention has a metal wafer layer (rather than a bulk or monocrystalline silicon layer), a low melting point oxide layer over the metal wafer layer, a buried insulation layer over the low melting point oxide layer, and a silicon layer (device layer) over the buried insulation layer. The buried insulation layer typically contains silicon dioxide, although the insulation layer may contain any other suitable insulating or oxide material.

The metal wafer layer contains a material that serves as a stable foundation for the remaining portions of the SOI substrate, yet can thermally conduct heat. The thermal conductivity of the metal wafer layer is relatively high compared to the thermal conductivity of the buried insulation layer, and higher than the thermal conductivity of bulk silicon. In a preferred embodiment, the metal wafer layer is selected so that it possesses a thermal coefficient of expansion close to that of silicon. The thermal coefficient of expansion of silicon is about $2.6 \times 10^{-6}$ cm/cm/° C. In one embodiment, metal wafer according to the present invention have a thermal coefficient of expansion from about $0.5 \times 10^{-6}$ cm/cm/° C. to about $10 \times 10^{-6}$ cm/cm/° C. In another embodiment, metal wafer according to the present invention have a thermal coefficient of expansion from about $1 \times 10^{-6}$ cm/cm/° C. to about $9 \times 10^{-6}$ cm/cm/° C. In yet another embodiment, metal wafer according to the present invention have a thermal coefficient of expansion from about $2 \times 10^{-6}$ cm/cm/° C. to about $8 \times 10^{-6}$ cm/cm/° C.

Examples of such metal wafers include one or more of nickel alloys such as Alloy 42 (about 42% nickel and about 58% iron), Alloy 46 (about 46% nickel and about 54% iron), Alloy 48 (about 48% nickel and about 52% iron), KOVAR® (about 29% nickel, about 17% cobalt and about 54% iron), and Invar 36 (about 36% nickel and about 64% iron). At least one of Alloy 42 and KOVAR® are preferred. In another preferred embodiment, the metal wafer is a nickel-iron alloy.

A low melting point oxide layer is formed over the metal wafer layer. A low melting point oxide layer has a melting point that is relatively low (lessor than) compared to the melting point of silicon dioxide. In one embodiment, the melting point of the low melting point oxide layer is less than about 1,500° C. In another embodiment, the melting point of the low melting point oxide layer is less than about 1,250° C. In yet another embodiment, the melting point of the low melting point oxide layer is less than about 1,150° C. In one embodiment, the low melting point oxide layer is a doped silicate glass, typically with one or more of lead, zirconium, boron, and phosphorus.

The low melting point oxide layer is formed in any suitable manner to a thickness suitable for facilitating heat removal/dissipation from the subsequently formed device layer. Formation typically involves chemical vapor deposition (CVD), but may also involve spin-on techniques. Such methods are known in the art. Low melting point oxides preferably contain at least about 5% by weight lead, zirconium, phosphorus and/or boron, more preferably at least about 10% by weight lead, zirconium, phosphorus and/or boron, even more preferably at least about 20% by weight lead, zirconium, phosphorus and/or boron. Examples of low melting point oxides include Pb doped glass, PbZr doped glass, tetraethylorthosilicate (TEOS), borophosphotetraethylorthosilicate (BPTEOS), phosphosilicate glass (PSG), and borophosphosilicate glass (BPSG). The melting point of silicon dioxide is about 1700° C., while the melting points of PSG and BPSG are generally around 1,000° C. to about 1,100° C. and generally around 700° to about 900° C., respectively, but vary depending upon the amount of phosphorus and/or boron present. The melting point of PbZr doped glass is generally around 400° C. to about 1,000° C., and this varies depending upon the amount of lead and/or zirconium present.

In one embodiment, generally, the thickness of the low melting point oxide layer is from about 250 Å to about 2,000 Å. In another embodiment, the thickness of the low melting point oxide layer is from about 300 Å to about 1,500 Å. In yet another embodiment, the thickness of the low melting point oxide layer is from about 500 Å to about 1,000 Å. In one embodiment the thickness of the low melting point oxide layer is less than about 60% of the thickness of the buried insulation layer. In another embodiment the thickness of the low melting point oxide layer is less than about 50% of the thickness of the buried insulation layer.

After formation of the low melting point oxide layer over the metal wafer layer, an insulation layer is formed thereover using any suitable technique including CVD and wet and dry oxidation processes. The thickness of the insulation layer is typically about 50% of the thickness of the thickness of the subsequently formed buried insulation layer, although any suitable thickness may be employed.

This structure containing the metal wafer layer and the low melting point oxide layer is then bonded to a second structure containing an insulation layer on bulk silicon. The second structure is made by providing a bulk silicon wafer, and forming an insulation layer over the bulk silicon wafer. In embodiments where the insulation layer contains silicon dioxide, the insulation layer is made by using any suitable technique including CVD and wet or dry oxidation processes. The two structures are fused at the respective insulation layers, and the bulk silicon of the second structure is etched back to a desired thickness to form an SOI substrate. It is noted that fusion of the two structures occurs at or below the melting points of the insulation layers.

The buried insulation layer of the SOI substrate typically has thickness from about 100 Å to about 5,000 Å. In another embodiment, the buried insulation layer has thickness from about 1,000 Å to about 4,000 Å. In yet another embodiment, the buried insulation layer has thickness from about 2,000 Å to about 3,500 Å. The device layer of the SOI substrate typically has thickness from about 500 Å to about 5,000 Å. In another embodiment, the device layer has thickness from about 1,000 Å to about 3,000 Å.

Referring to FIGS. 1 to 4, a specific example of the present invention is described. Specifically referring to FIG. 1, a first structure 10 is formed. Initially, a metal substrate or wafer 12 is provided. The metal wafer 12 contains Alloy 42. A low melting point oxide layer 14 is deposited over the metal wafer 12. In this embodiment, BPSG is deposited via CVD techniques over the metal wafer 12 to a thickness of about 700 Å. Alternatively, one or more of BPTEOS, and PSG can be used in place of or in addition to BPSG. An insulation layer 16 containing silicon dioxide is then formed over the low melting point oxide layer 14 by CVD techniques. Either low pressure chemical vapor deposition (LPCVD) or plasma enhanced chemical vapor deposition (PECVD) may be employed. In this embodiment, the insulation layer 16 is formed by PECVD using silane and oxygen. The insulation layer 16 has a thickness of about 1,500 Å.

Figure 2:
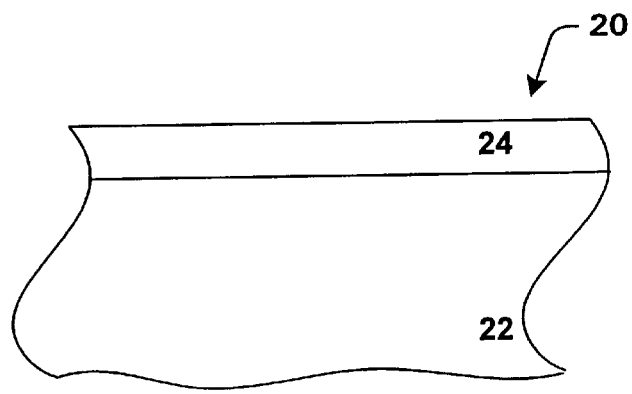
FIG. 2 is cross-sectional view of a second structure used to make an SOI substrate according to one embodiment of the present invention.

Referring to FIG. 2, a second structure 20 is provided. The second structure 20 contains a bulk silicon layer 22 and an insulation layer 24 thereover. In this embodiment, the insulation layer 24 contains silicon dioxide. Also in this embodiment, the thickness of the insulation layer 24 is about 1,500 Å.

Figure 3:
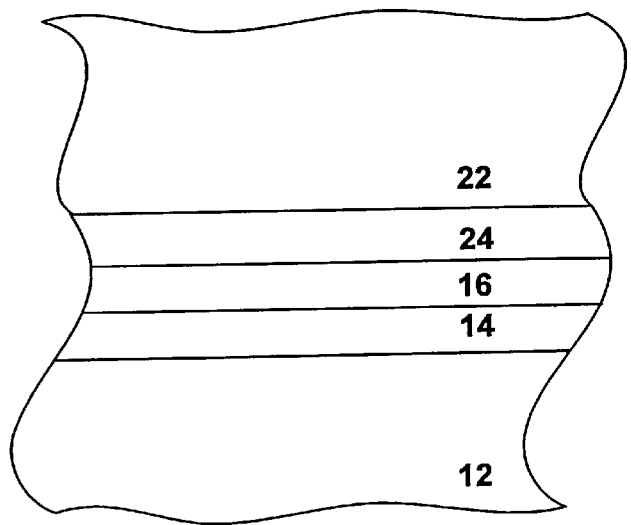
FIG. 3 is cross-sectional view of a bonded structure used to make an SOI substrate according to one embodiment of the present invention.

Referring to FIG. 3, the first structure 10 is bonded to the second structure 20 at the respective insulation layers 16 and 24. The respective insulation layers 16 and 24 are fused by application of heat for a sufficient period of time to bond the first and second structures 10 and 20. For example, the first and second structures 10 and 20 are held together for about 2 hours under a temperature from about 700° C. to about 1,100 ° C., such as 1050° C.

Figure 4:
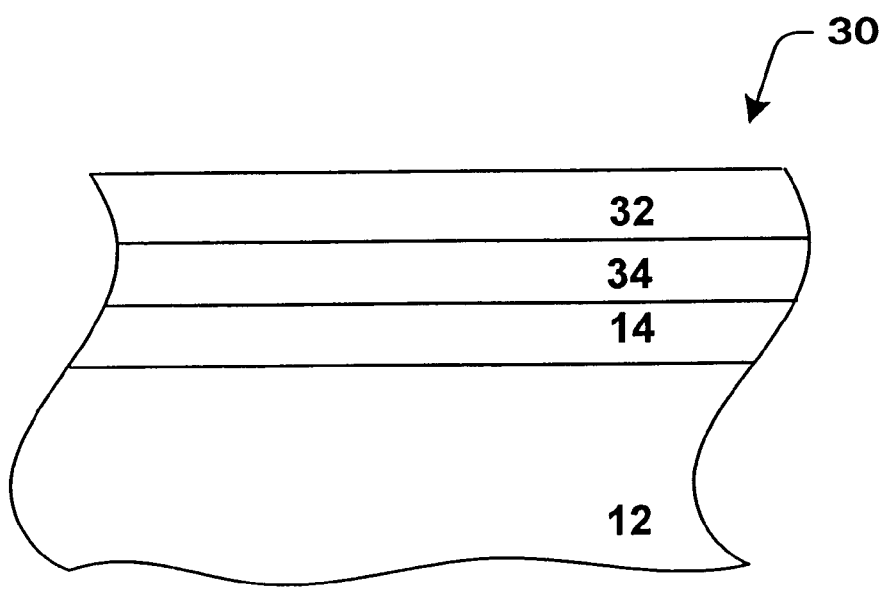
FIG. 4 is cross-sectional view of an SOI substrate according to one embodiment of the present invention.

Referring to FIG. 4, the bulk silicon layer 22 of in FIG. 3 of the second structure 20 is etched to a desired thickness to provide an SOI substrate 30 and specifically a device layer 32. The SOI substrate 30 contains metal wafer 12, low melting point oxide layer 14, buried insulation layer 34, and device layer 32. The thickness of the device layer 32 is about 1,500 Å. The thickness of the insulation layer 34 (formerly the insulation layers 16 and 24) is about 3,000 Å. The low melting point oxide layer 14 remains about the same as initially deposited (about 700 Å). The low melting point oxide layer 14 has a thickness that is about 23% of the thickness of the buried insulation layer 34.

The SOI substrate 30 has good heat removal properties due to the presence of the metal wafer containing Alloy 42. In particular, the high thermal conductivity of the metal wafer (relative to silicon) removes heat that may locally accumulate in certain areas (typically near or under devices and/or conductive structures) of the device layer and buried insulation layer. The high thermal conductivity of the metal wafer also dissipates heat that may locally accumulate in certain areas of the device layer and buried insulation layer (or distributes the heat throughout the metal wafer and the low melting point oxide layer).

Referring again to FIGS. 1 to 4, another specific example of the present invention is described. Specifically referring to FIG. 1, a first structure 10 is formed. Initially, a metal substrate or wafer 12 is provided. The metal wafer 12 contains Alloy 42. A low melting point oxide layer 14 is deposited over the metal wafer 12. In this embodiment, BPTEOS is deposited via CVD techniques over the metal wafer 12 to a thickness of about 900 Å. Alternatively, one or more of BPSG, and PSG can be used in place of or in addition to BPTEOS. An insulation layer 16 containing silicon dioxide is then formed over the low melting point oxide layer 14 by CVD techniques. Either low pressure chemical vapor deposition (LPCVD) or plasma enhanced chemical vapor deposition (PECVD) may be employed. In this embodiment, the insulation layer 16 is formed by PECVD using silane and oxygen. The insulation layer 16 has a thickness of about 1,000 Å.

Referring to FIG. 2, a second structure 20 is provided. The second structure 20 contains a bulk silicon layer 22 and an insulation layer 24 thereover. In this embodiment, the insulation layer 24 contains silicon dioxide. Also in this embodiment, the thickness of the insulation layer 24 is about 1,000 Å.

Referring to FIG. 3, the first structure 10 is bonded to the second structure 20 at the respective insulation layers 16 and 24. The respective insulation layers 16 and 24 are fused by application of heat for a sufficient period of time to bond the first and second structures 10 and 20. For example, the first and second structures 10 and 20 are held together for about 3 hours under a temperature from about 700° C. to about 1,100° C., such as about 1,050° C.

Referring to FIG. 4, the bulk silicon layer 22 of in FIG. 3 of the second structure 20 is etched to a desired thickness to provide an SOI substrate 30 and specifically a device layer 32. The SOI substrate 30 contains metal wafer 12, low melting point oxide layer 14, buried insulation layer 34, and device layer 32. The thickness of the device layer 32 is about 2,000 Å. The thickness of the insulation layer 34 (formerly the insulation layers 16 and 24) is about 2,000 Å. The low melting point oxide layer 14 remains about the same as initially deposited (about 900 Å). The low melting point oxide layer 14 has a thickness that is about 45% of the thickness of the buried insulation layer 34.

The SOI substrate 30 has good heat removal properties due to the presence of the metal wafer containing Alloy 42. In particular, the high thermal conductivity of the metal wafer (relative to silicon) remove heat that may locally accumulate in certain areas (typically near or under devices and/or conductive structures) of the device layer and buried insulation layer. The high thermal conductivity of the metal wafer also dissipates heat that may locally accumulate in certain areas of the device layer and buried insulation layer (or distributes the heat throughout the metal wafer and the low melting point oxide layer).

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a silicon-on-insulator substrate, comprising:

providing a metal wafer comprising at least one of Alloy 42, Alloy 46, Alloy 48, KOVAR®, and Invar 36;

forming a low melting point oxide layer over the metal wafer, wherein the low melting point oxide layer comprises at least one of Pb doped glass, PbZr doped glass, tetratehylorthosilicate, borophosphotetraethylorthosilicate, phosphosilicate glass, and borophosphosilicate glass;

forming a first insulation layer over the low melting point oxide layer to provide a first structure;

providing a second structure comprising a silicon layer and a second insulation layer;

bonding the first structure and the second structure together so that the first insulation layer is adjacent the second insulation layer forming a buried insulation layer; and removing a portion of the silicon layer thereby providing the silicon-on-insulator substrate comprising a silicon device layer, the buried insulation layer, the low melting point layer, and the metal wafer.

2. The method of claim 1, wherein the low melting point oxide layer has a thickness from about 250 Å to about 2,000 Å.

3. The method of claim 1, wherein the low melting point oxide layer has a thickness from about 300 Å to about 1,500 Å.

4. The method of claim 1, wherein at least one of the first insulation layer and the second insulation layer comprise silicon dioxide.

5. The method of claim 1, wherein the metal wafer has a thermal coefficient of expansion from about $2\times10^{-6}$ cm/cm/° C. to about $8\times10^{-6}$ cm/cm/° C.

6. A silicon-on-insulator substrate, comprising:

a metal wafer layer comprising at least one of Alloy 42, Alloy 46, Alloy 48, KOVAR®, and Invar 36;

a low melting point oxide layer comprising at least one of tetraethylorthosilicate, PbZr doped glass, borophosphotetraethylorthosilicate, phosphosilicate glass, and borophosphosilicate glass over the metal wafer layer;

a buried insulation layer over the low melting point oxide layer; and a silicon device layer comprising silicon over the buried insulation layer.

7. The silicon-on-insulator substrate of claim 6, wherein the low melting point oxide layer has a thickness from about 250 Å to about 2,000 Å, the buried insulation layer has a thickness from about 50 Å to about 5,000 Å, and the device layer has a thickness from about 500 Å to about 5,000 Å.

8. The silicon-on-insulator substrate of claim 6, wherein the low melting point oxide layer has a thickness from about 300 Å to about 1,500 Å, the buried insulation layer has a thickness from about 50 Å to about 5,000 Å, the device layer has a thickness from about 500 Å to about 5,000 Å.

9. The silicon-on-insulator substrate of claim 6, wherein the low melting point oxide layer comprises at least one of PbZr doped glass, borophosphotetraethylorthosilicate and borophosphosilicate glass.

10. The silicon-on-insulator substrate of claim 6, wherein the buried insulation layer comprises silicon dioxide.

11. The silicon-on-insulator substrate of claim 6, wherein the metal wafer layer has a thermal coefficient of expansion from about $1\times10^{-6}$ cm/cm/° C. to about $9\times10^{-6}$ cm/cm/° C.

12. The silicon-on-insulator substrate of claim 6, wherein the low melting point oxide layer has a thickness that is at least about 60% smaller than a thickness of the buried insulation layer.

* * * * *